(12) United States Patent
Frye et al.

(10) Patent No.: US 6,232,047 B1
(45) Date of Patent: May 15, 2001

(54) FABRICATING HIGH-Q RF COMPONENTS

(75) Inventors: Robert Charles Frye, Piscataway; Yee Leng Low; King Lien Tai, both of Berkeley Heights, all of NJ (US)

(73) Assignee: Agere Systems Inc., Berkeley Heights, NJ (US)

( * ) Notice: Subject to any disclaimer, the term of this patent is extended or adjusted under 35 U.S.C. 154(b) by 0 days.

(21) Appl. No.: 09/261,093

(22) Filed: Mar. 2, 1999

(51) Int. Cl.[7] .................................................... G03C 5/00
(52) U.S. Cl. ........................ 430/324; 430/322; 430/318
(58) Field of Search .................................. 430/318, 315, 430/314, 322, 324; 427/466, 467, 468, 125, 126.5, 225, 229, 265, 504, 510, 512, 498, 286

(56) References Cited

U.S. PATENT DOCUMENTS 5,250,394 * 10/1993 Wei ........................................ 430/313
5,285,570 * 2/1994 Fulinara ................................ 29/830

* cited by examiner

*Primary Examiner*—Mark F. Huff
*Assistant Examiner*—Saleha R. Mohamedulla
(74) *Attorney, Agent, or Firm*—Thomas, Kayden, Horstemeyer & Risley LLP

(57) ABSTRACT

The specification describes method for improving the edge acuity of conductive metal strips formed by thick film paste techniques. The advantages of the bulk properties of strips formed using thick film technology are realized while the drawback of poor edge definition is overcome using a thin film trim strip at the edge of the conductive strip.

10 Claims, 3 Drawing Sheets

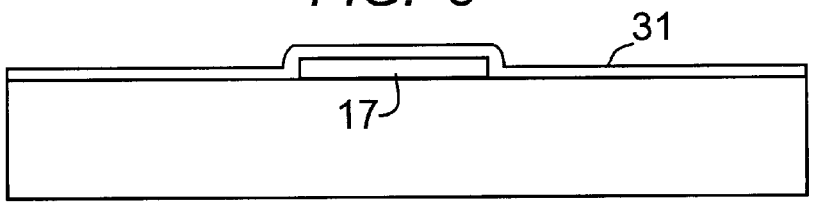
FIG. 5
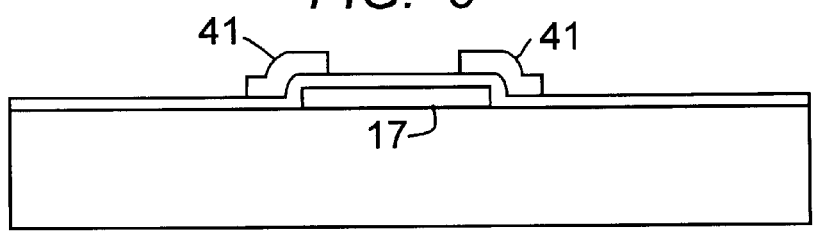
FIG. 6
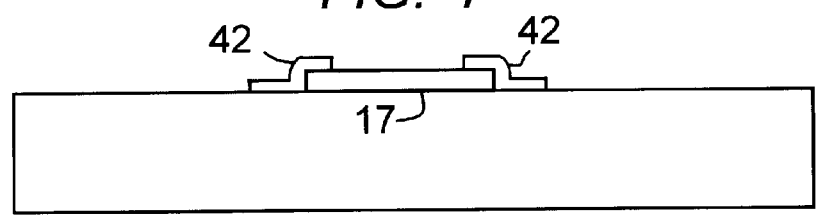
FIG. 7
FIG. 8
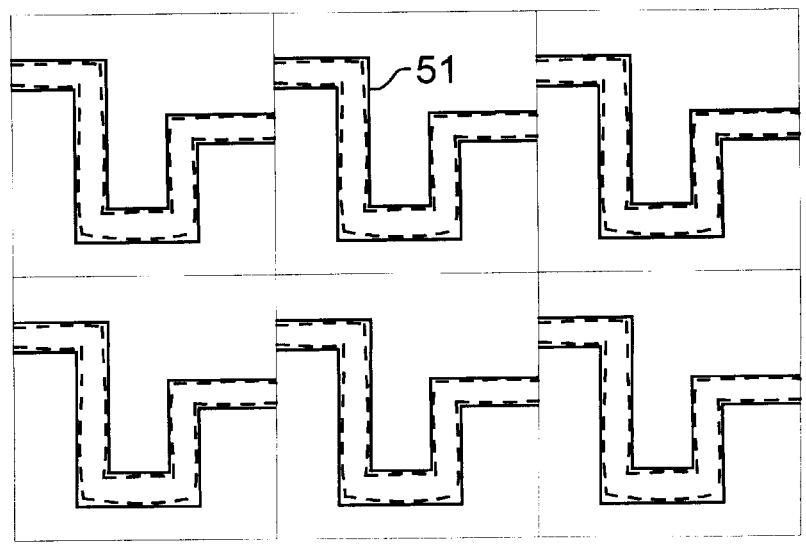

FABRICATING HIGH-Q RF COMPONENTS

FIELD OF THE INVENTION

This invention relates to methods for forming high-Q (quality factor) components for high frequency RF circuits. More specifically it relates to controlling dimensions of strip lines and other RF components to produce uniform electrical performance.

BACKGROUND OF THE INVENTION

The dramatic growth of portable and hand held communications equipment, such as wireless, internet access, local area network equipment, has created an enormous demand for bandwidth. With the band below 1 GHz essentially saturated, new equipment will operate between 1 and 30 GHz, and future systems already in planning operate up to 100 GHz. These high frequencies place heavy demands on existing device fabrication technologies, and in some cases will require the development of new techniques and designs.

The basic fabric of microwave devices are microstrip lines. The power loss in microstrip lines largely determines the overall Q factor of the device. Low loss increases device performance, reduces cost of the overall system, and reduces power consumption. The latter feature is especially critical for portable and hand held equipment.

Loss in microstrip lines depends to first order on the transmission efficiency of the transmission medium. This would appear to be primarily a function of the Q of the microstrip material. However, in many cases other factors dominate. For example, thin film microstrips are typically formed by sputtering onto a substrate using a buffer layer to improve adhesion between the substrate and the microstrip. The interface between the buffer layer and the microstrip is a source of significant loss, and this loss increases dramatically with frequency. In thick film microstrips, while the Q of the material is typically high, control of the microstrip edge definition is relatively poor, and thick film microstrips tend to have rough surfaces. Surface roughness and edge definition are small loss factors at low frequencies, but become very significant at high frequencies.

Polymer striplines overcome some of these deficiencies, but inexpensive, low loss polymer materials are of limited availability.

Thus there is a need in the art for new approaches to stripline manufacture. The ideal would be a process and device which captures the bulk properties of thick film striplines with the geometric control of thin film technology.

STATEMENT OF THE INVENTION

We have developed a hybrid thick-thin film process for making metal striplines having the attributes just mentioned. The bulk of the stripline is made using thick film methods. To obtain precise geometry of the strip, a thin film trim strip is framed around the edge of the thick film strip. The electrical properties of the line are then defined predominantly by the bulk properties of the thick film material, while the geometry of the line is defined by the thin film trim strip.

BRIEF DESCRIPTION OF THE DRAWING

FIGS. 5–7 are schematic representations illustrating one embodiment of the invention;

FIG. 8 is a plan view of the product of the process of the invention;

DETAILED DESCRIPTION

Figure 1:
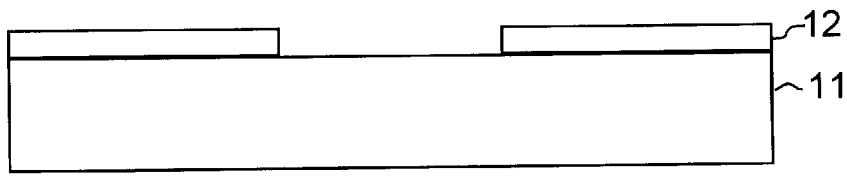
FIGS. 1–3 are schematic representations of steps in the process for forming strip conductors using a thick film approach.
Figure 2:
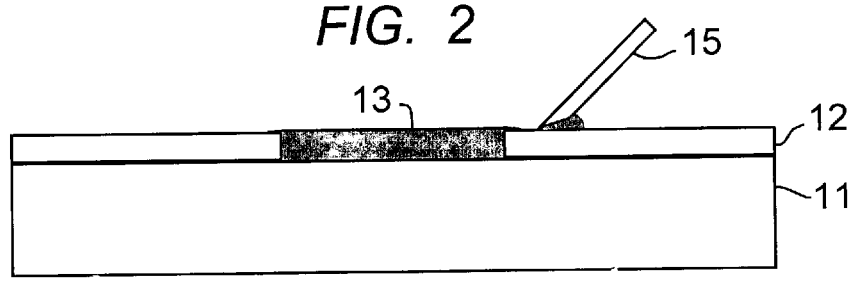
Figure 3:
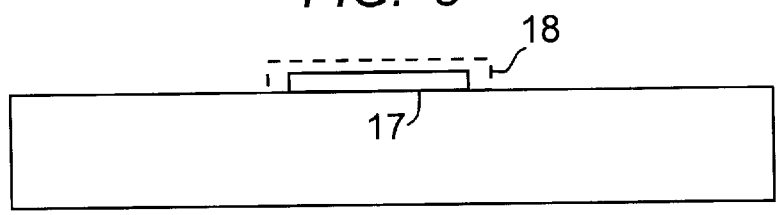
Figure 4:
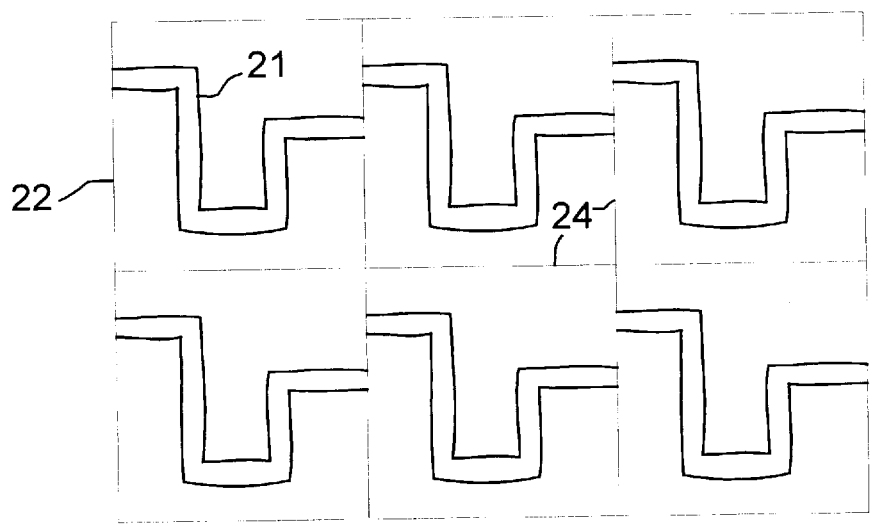
FIG. 4 is a schematic representation in plan view of a batch of strip conductors made using the thick film process of FIGS. 1–3.

Referring to FIG. 1, a substrate 11 is shown with a stencil mask 12 for printing a conductive paste strip conductor on the substrate. The substrate is typically ceramic or epoxy glass and may be an interconnection substrate, or may be a ceramic substrate for a microwave component such as a microwave stripline or a microwave phase shifter. In FIG. 2, conductive paste 13 is shown being applied to the stencil 12 using a standard technique represented here by paste applicator 15. This technique is intended to represent a variety of possible methods for selectively applying conductive paste to a substrate. Conductive inks may also be used and applied by screen printing, or printing with a patterned pad. These techniques, and the materials used to make the conductor, are well known in the art. They are frequently referred to as additive techniques. They share the common property that conductive particles are suspended in a carrier for convenient application to the substrate in the pattern desired, then the substrate is heated to drive off the carrier, and fired to coalesce the conductive particles into a solid conductor strip. The conductor strip after heating and firing is shown at 17 in FIG. 3. As is well known, lines produced with conductive paste techniques shrink substantially when heated and fired. This is illustrated in FIG. 3 where the dashed line 18 represents the shape of the original paste. Shrinkage is typically non-uniform. This is particularly the case with conductor patterns with multiple turns. The linewidth of the conductor lines in the resulting pattern is non-uniform, and the pattern significantly distorted, as shown in FIG. 4. FIG. 4 is a plan view of a typical microwave stripline pattern 21 on a ceramic substrate 22. The figure shows several substrates to illustrate that a batch process is used, with several substrates processed from a single large substrate. The individual substrates are singulated along lines 24.

Typical paste materials are metal powders mixed with an organic binder. The powders can be selected from a variety of conductive metals, e.g. silver, copper, gold, tungsten. Although referred to in the art as thick film technology, advanced paste techniques can produce conductor linewidths as small as 10–25 µm, and comparable conductor thicknesses. In state of the art technology, the strip conductor 17 in FIG. 3 will have dimensions typically in the range 10 . 500 µm in width by 8–20 µm thick.

Significant variations in linewidth, e.g. as shown in FIG. 4, may introduce serious loss in the RF circuit. Variations in length may alter the frequency response. The solution to this problem, according to the invention, is to trim the edges of the conductor strip using a thin film technique. Referring to FIG. 5, a thin film of metal 31 is blanket deposited over the structure shown in FIG. 3, i.e. over substrate 11 and conductor 17. It should be recognized, particularly with respect to FIG. 5, that the drawing is not necessarily to scale. Although the invention contemplates the use of so-called thick and thin film methods, the actual layers used according to each method may be comparable in thickness. However, edge acuity, which is a main objective of the invention, is best served by making layer 31 thinner than the conductive strip 17. Thus the typical thickness of layer 31 preferably ranges from 1–50 µm. The material of layer 31 may be any suitable metal, e.g. Ag, Cu, Au, Al, Ta, TaN, TiN, etc. It may be desirable for layer 31 to comprise a metal or metal alloy that is different from the material of layer 17. This allows some etch selectivity between the layers during patterning of layer 31, and reduces the risk of undercutting or overetching layer 17.

The layer 31 is then patterned, preferably by a lithographic technique, to form the trim strip. Referring to FIG. 6, a lithographic mask 41 is shown covering the portions of layer 31 along the edges of the strip conductor 17. The mask is formed by conventional means, e.g. a photoresist layer is spun on, exposed through a photomask with the trim strip pattern, then developed. With the mask in place, the exposed portions of layer 31 are etched away leaving the structure shown in FIG. 7, with trim strip 42 edging the strip conductor 31. The effect of the trim strip 42 is better seen in the plan view of FIG. 8, which corresponds to FIG. 4 (prior to application of the trim strip). The improvement in edge acuity of the strip conductor 51 is evident.

Figure 9:
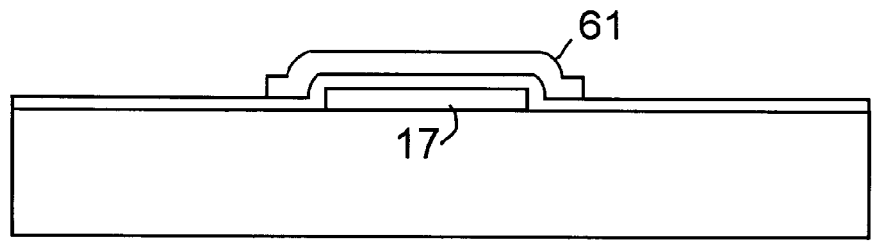
FIGS. 9 and 10 are schematic representations, similar to those of FIGS. 6 and 7 illustrating another embodiment of the invention.
Figure 10:
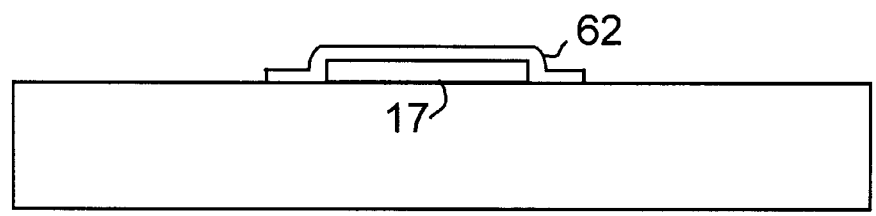

The basic objective of the invention is to trim the edge of the thick film strip conductor and the direct approach to reaching this objective is to apply the trim strip to the edge of the strip conductor as shown in FIGS. 5–7. However, there may be advantages in some cases to having the thin film extend over the entire strip conductor. In FIG. 8, the outside edge of the trim strip is shown but the inside edge is omitted. This illustrates the embodiment just mentioned, where the thin film conductor or trim strip extends over the entire thick film conductor. FIGS. 9 and 10 show this embodiment wherein photoresist layer 61 covers the entire thick film strip in FIG. 9, and after etching and removal of the photoresist, the thin film trim strip 62 is shown covering the entire thick film conductor 17. Use of this approach reduces the possibility of overetching the thick film layer 17 during the patterning of the thin film. It also guards against misalignment of mask 41 (FIG. 6). Moreover, loss due to surface roughness of the thick film strip is also reduced.

Figure 11:
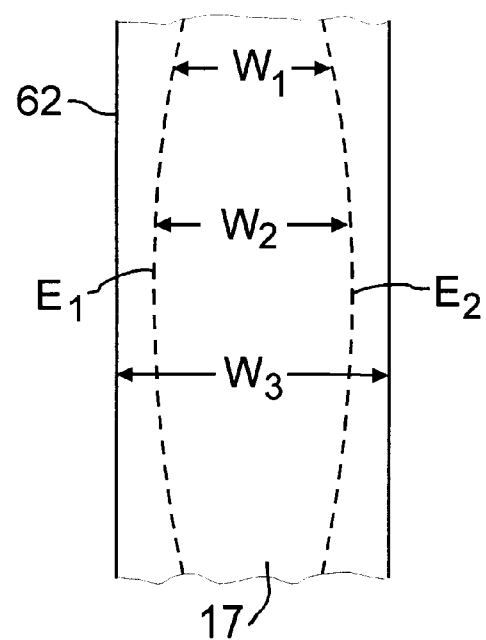
FIG. 11 is a schematic diagram showing dimensions used for describing features of the invention.

The invention described above has among its features that the main portion of the conductive strip is formed by applying conductive metal paste on a substrate and firing the conductive metal paste to form the conductive strip. The resulting conductive strip has uneven edges and can be defined as a conductive strip bounded by edge $E_1$ and edge $E_2$, and having a portion thereof s with width $W_1$ as measured between edge $E_1$ and edge $E_2$, and another portion thereof with width $W_2$ as measured between edge $E_1$ and edge $E_2$, where $W_1$ and $W_2$ are not equal. These dimensions are shown and related to the structure of the invention in FIG. 11. The distortion in the width is exaggerated for the purpose of exposition. The trim strip of the invention is basically formed by depositing a metal layer over the conductive strip, the metal layer having a width $W_3$, where $W_3 > W_1$ and $> W_2$, and the metal layer extends over edge $E_1$ and edge $E_2$. In the embodiment represented by FIGS. 5–7, the trim strip comprises two metal layers, one covering edge $E_1$ and the other covering edge $E_2$. In the embodiment represented by FIGS. 8–11, the trim strip essentially covers the conductive strip.

The process design for implementing the invention may be adjusted so that the nominal width of the thick film conductive strip is deliberately reduced, e.g. by 5–25%, from the final stripline value to allow for the trim strip. The design width of the desired stripline is then the width of the trim strip, i.e. $W_3$ in FIG. 11.

Various additional modifications of this invention will occur to those skilled in the art. All deviations from the specific teachings of this specification that basically rely on the principles and their equivalents through which the art has been advanced are properly considered within the scope of the invention as described and claimed.

What is claimed is:

1. Process comprising:
   (a) depositing a conductive strip on a substrate by the steps of:
      (i) applying a conductive metal paste on said substrate and
      (ii) firing said conductive metal paste to form the conductive strip,
   said conductive strip bounded by edge $E_1$ and edge $E_2$ and having a portion thereof with width $W_1$ as measured between edge $E_1$ and edge $E_2$ and another portion thereof with width $W_2$ as measured between edge $E_1$ and edge $E_2$, where $W_1$ and $W_2$ are not equal,
   (b) depositing a blanket metal layer over the surface of said conductive strip and said substrate,
   (c) masking selected portions of the metal layer with a photolithographic mask leaving portions of the metal layer exposed,
   (d) etching the exposed portions of the metal layer to form a metal trim strip, said metal trim strip having a width $W_3$, where $W_3 > W_1$ and $W_3 > W_2$, and wherein said metal trim strip extends over edge $E_1$ and onto a portion of the substrate and extends over edge $E_2$ and onto a portion of the substrate.

2. The process of claim 1 wherein said conductive strip has a thickness in the range 10–250 μm.

3. The process of claim 2 wherein said metal trim strip has a thickness in the range 1–50 μm.

4. The process of claim 1 wherein said conductive metal paste is selected from the group consisting of Cu, Ag, Au and W paste.

5. The process of claim 4 wherein the metal of said metal trim strip is selected from the group consisting of Cu, Ag, Au, Al, TiN, TaN, and Ta.

6. Process comprising:
   (a) depositing a conductive strip on a substrate by the steps of:
      (i) applying a conductive metal paste on said substrate and
      (ii) firing said conductive metal paste to form the conductive strip, said conductive strip bounded by edge $E_1$ and edge $E_2$ and having a portion thereof with width $W_1$ as measured between edge $E_1$ and edge $E_2$ and another portion thereof with width $W_2$ as measured between edge $E_1$ and edge $E_2$, where $W_1$, and $W_2$ are not equal,
   (b) depositing a blanket metal layer over the surface of said conductive strip and said substrate,
   (c) masking selected portions of the metal layer with a photolithographic mask leaving portions of the metal layer exposed,
   (d) etching the exposed portions of the metal layer to form a first metal trim strip that extends over the edge $E_1$ of said conductive strip and onto a portion of the substrate and a second metal trim strip that extends over the edge $E_2$ of said conductive strip and onto a portion of the substrate.

7. The process of claim 6 wherein said conductive strip has a thickness in the range 10–250 μm.

8. The process of claim 7 wherein said metal layer has a thickness in the range 1–50 μm.

9. The process of claim 6 wherein said conductive metal paste is selected from the group consisting of Cu, Ag, Au, and W paste.

10. The process of claim 9 wherein the metal of said metal layer is selected from the group consisting of Cu, Ag, Au, Al, TiN, TaN, and Ta.

* * * * *